United States Patent
Fair et al.

(10) Patent No.: US 7,144,806 B1
(45) Date of Patent: Dec. 5, 2006

(54) ALD OF TANTALUM USING A HYDRIDE REDUCING AGENT

(75) Inventors: James A. Fair, Mountain View, CA (US); Jungwan Sung, Santa Clara, CA (US); Nerissa Taylor, Milpitas, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/279,147

(22) Filed: Oct. 23, 2002

(51) Int. Cl.
*H01L 21/44* (2006.01)
*H01L 21/4763* (2006.01)
*H01L 21/8242* (2006.01)

(52) U.S. Cl. .................. 438/653; 438/240; 438/627; 438/643; 438/648; 438/656

(58) Field of Classification Search ............. 438/240, 438/627, 643, 648, 653, 656, 683, 687; 257/762
See application file for complete search history.

(56) References Cited

U.S. PATENT DOCUMENTS

| | | | | |
|---|---|---|---|---|
| 5,851,589 A | * | 12/1998 | Nakayama et al. | 427/248.1 |
| 5,893,752 A | * | 4/1999 | Zhang et al. | 438/687 |
| 5,910,880 A | * | 6/1999 | DeBoer et al. | 361/311 |
| 5,916,365 A | | 6/1999 | Sherman | |
| 6,054,398 A | * | 4/2000 | Pramanick | 438/784 |
| 6,139,922 A | * | 10/2000 | Kaloyeros et al. | 438/758 |
| 6,140,231 A | * | 10/2000 | Lin et al. | 438/653 |
| 6,200,893 B1 | * | 3/2001 | Sneh | 438/685 |
| 6,203,613 B1 | | 3/2001 | Gates et al. | |
| 6,221,792 B1 | * | 4/2001 | Yang et al. | 438/776 |
| 6,284,646 B1 | * | 9/2001 | Leem | 438/629 |
| 6,319,766 B1 | * | 11/2001 | Bakli et al. | 438/240 |
| 6,586,330 B1 | * | 7/2003 | Ludviksson et al. | 438/643 |

OTHER PUBLICATIONS

Yoshio et al. "Handbook of Semiconductor Manufacturing Technology", 2000, pp. 309-316.*
Kim et al., "The Growth of Tantalum Thin Films by Plasma-Enhanced Atomica Layer Deposition and Diffusion Barrier Properties," Mat. Res. Soc. Symp. Proc. vol. 716, 6 pages, 2002.

(Continued)

*Primary Examiner*—Maria F. Guerrero
(74) *Attorney, Agent, or Firm*—Beyer Weaver & Thomas LLP.

(57) ABSTRACT

An ALD method deposits conformal tantalum-containing material layers on small features of a substrate surface. The method includes the following principal operations: depositing a thin conformal and saturated layer of tantalum-containing precursor over some or all of the substrate surface; using an inert gas or hydrogen plasma to purge the halogen byproducts and unused reactants; reducing the precursor to convert it to a conformal layer of tantalum or tantalum-containing material; using another purge of inert gas or hydrogen plasma to remove the halogen byproducts and unused reactants; and repeating the deposition/reduction cycles until a desired tantalum-containing material layer is achieved. An optional step of treating each newly formed surface of tantalum containing material with a nitrogen-containing agent can be added to create varying amounts of tantalum nitride.

20 Claims, 6 Drawing Sheets

OTHER PUBLICATIONS

George et al., "Surface Chemistry for Atomic Layer Growth," *J. Phys. Chem.* 1996, 100, 13121-13131.

Martensson and Carlsson, "Atomic Layer Epitaxy of Copper on Tatalum," Chem. Vapor Deposition 1997, 3, No. 1, 45-50.

Utriainen et al., "Studies of Metallic Thin Film Growth in an Atomic Layer Epitaxy Reactor Using $M(acac)_2$ (M=Ni, Cu, Pt) Precursors," Applied Surface Science 157 (2000), 151-158.

Kulki et al., "Atomic Layer Epitaxy Growth of Tatalum Oxide Thin Films from $Ta(OC_2H_5)_5$ and $H_2O$," J. Electrochem. Soc., vol. 142, No. 5, 1670-1675, 1995.

Yokoyama, et al., "Atomic Layer Controlled Deposition of Silicon Nitride an in situ Growth Observation by Infrared Reflection Absorption Spectroscopy," Applied Surface Science 112, 75-81, 1997.

* cited by examiner

ALD OF TANTALUM USING A HYDRIDE REDUCING AGENT

FIELD OF THE INVENTION

This invention pertains to methods for tantalum and tantalum containing material deposition. More specifically, the invention pertains to methods that deposit a layer of tantalum or tantalum silicide material on a semiconductor device to improve adhesion between deposited copper metal and an underlying diffusion barrier, for example.

BACKGROUND OF THE INVENTION

Damascene processes for forming integrated circuit metalization layers employ electroplated copper lines formed in vias and trenches of supporting dielectric layers. Copper atoms are rather mobile and can easily diffuse or migrate into the supporting dielectric and thereby reduce its resistance. To address this problem, damascene processes employ thin diffusion barrier layers on the entire exposed surface of the dielectric. These barrier layers are made from a material that effectively blocks transport of copper atoms into the adjacent dielectric. Typically, the barrier layers comprise slightly conductive titanium nitride or tantalum nitride at a thickness of approximately 10 to 100 angstroms.

The diffusion barrier materials are not sufficiently conductive to support direct electroplating of copper from solution. So damascene processes first deposit a thin copper seed layer over the entire exposed diffusion barrier layer. This layer is typically formed by physical vapor deposition or electroless deposition and has a thickness of approximately 50 to 1500 angstroms. Onto the seed layer, the damascene process deposits a bulk layer of copper by electroplating. Electroplating fills all vias and trenches and continues until copper covers all exposed dielectric. Finally, the excess copper is removed by chemical mechanical polishing to provide a planar surface of exposed copper lines encased by dielectric and diffusion barriers.

One problem encountered in the above process involves poor adhesion of the copper seed layer (and copper in general) to the underlying diffusion barrier layer. It turns out that copper does not adhere well to the diffusion barrier materials. In fact, copper does not adhere well to a wide array of materials employed in integrated circuits. One notable exception is tantalum. So, possibly the damascene process flow could employ a tantalum adhesion layer interposed between the diffusion barrier layer and the copper seed layer.

Known processes for depositing thin tantalum layers on substrates include chemical vapor deposition (CVD) employing organometallic precursors. The deposition reactions are often endothermic (or have a positive $\Delta G$). As a consequence, process must provide energy to drive the deposition reaction. This involves heating the wafer, including the previously deposited copper within the wafer. At approximately 450 degrees C., copper's material properties begin to transform so that it becomes more mobile. Unfortunately, there are currently no thermal CVD processes available for depositing tantalum films at temperatures below 450 degrees C.

A lower-temperature alternative to using traditional thermal CVD is atomic layer deposition (ALD), also known as atomic layer epitaxy (ALE) or atomic layer chemical vapor deposition (ALCVD). Unlike CVD, ALD relies on a self-limiting, saturated, surface, growth mechanism in which the reactants are introduced alternately over the substrate surface, separated by inert gas purging. Deposition temperature is selected such that only a saturated layer of precursor is adsorbed on the substrate surface and does not depend as much on reactant flow as the relatively higher temperatures that CVD demands.

Equally important as the technique to depositing tantalum is the choice of reactant precursors. In ALD, the precursor must readily adsorb in a self-limiting mode, and once adsorbed must readily react with the co-reactant to form the desired film. Thus, many useful CVD precursors are not viable as ALD precursors, and it is not trivial to select a precursor for the ALD method. In a metal ALD process, it is especially challenging to find a metal precursor that is stable against decomposition, adsorbs evenly on the surface and can also be easily reduced.

SUMMARY OF THE INVENTION

The present invention provides an ALD process using a tantalum-halide precursor and a hydride reducing agent to deposit a thin, highly conformal tantalum or tantalum-containing film. The methods include using a tantalum halide to deposit a saturated layer of tantalum precursor onto a substrate, then contacting the tantalum precursor with a hydride reducing agent (a silicon hydride or a boron hydride, for example) to form a thin layer of tantalum-containing material (tantalum metal or tantalum silicide or tantalum boride, for example). This composes one cycle of the ALD process. Another thin conformal layer of tantalum-containing material can then be deposited on top of this newly formed tantalum layer by introducing more of the tantalum halide and then introducing more reducing hydride. It may be desirable to purge the reaction chamber with inert gas between each reactant exposure and after each successive deposition cycle. Subsequent layers can be added to create a tantalum-containing material layer with a desired thickness to within about 3 angstroms.

One particularly important application for this invention is in damascene techniques in semiconductor device fabrication. The tantalum or tantalum-containing film is deposited on a partially fabricated semiconductor device, in which a diffusion barrier has been deposited on a dielectric material. The tantalum or tantalum-containing film can act as an adhesion layer for subsequent copper deposition. Although, the film can have other applications unrelated to adhesion. For example, when the film contains nitrogen it may serve as a diffusion barrier.

An important aspect of the invention is the fact that the tantalum or tantalum-containing film may be deposited on such damascene product lines without heating the substrate above 450° C., a temperature at which copper begins to be susceptible to mobility and annealing.

DETAILED DESCRIPTION OF THE PREFERRED EMBODIMENTS

Introduction

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

Figure 1:
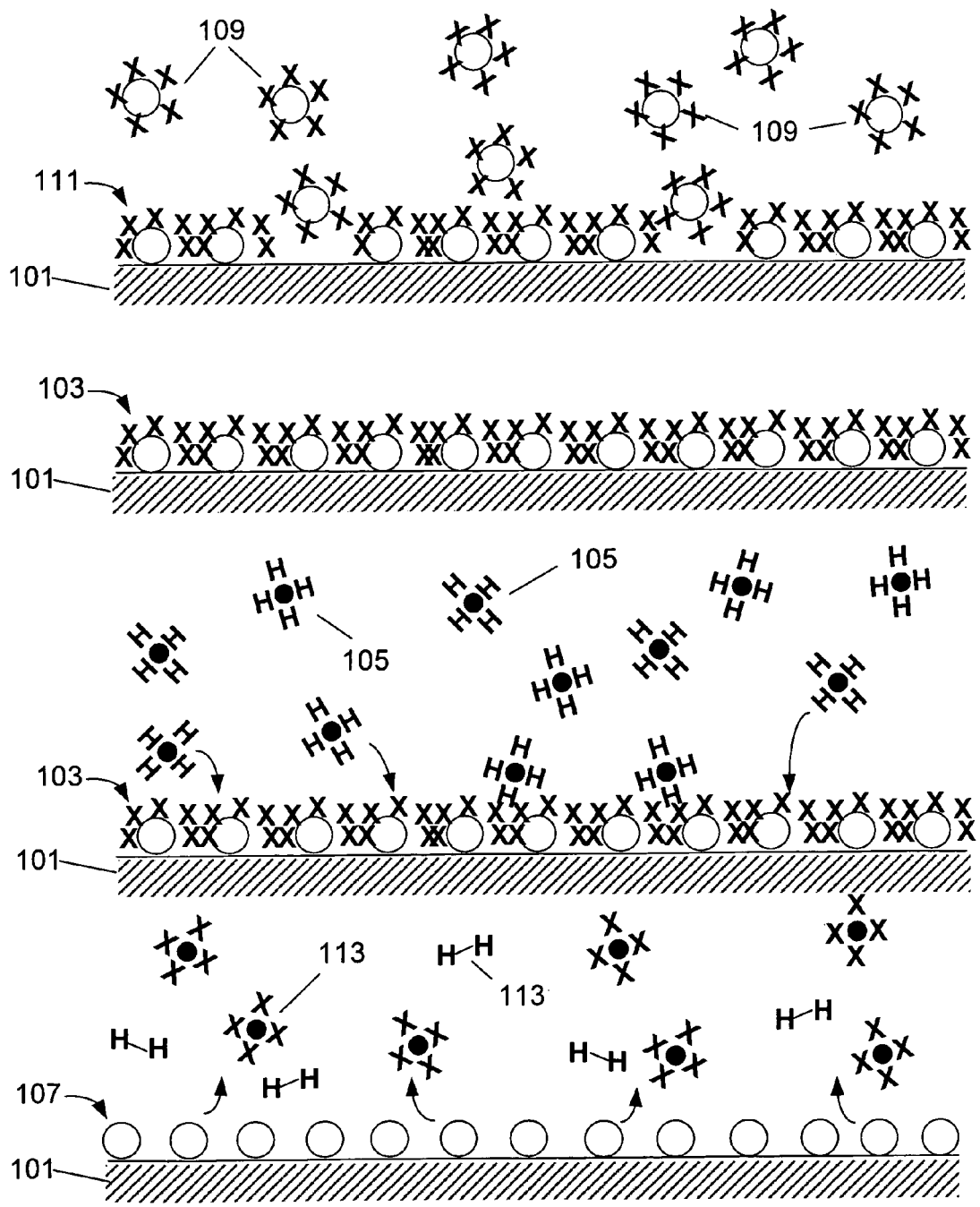
FIG. 1 illustrates one process cycle of a generic ALD process in which reactants are sequentially introduced to a substrate surface.

Atomic layer deposition (ALD) can be considered a variant of the well-established chemical vapor deposition (CVD), but based on separated surface-controlled reactions. In ALD, reactants are directed alternately over a substrate surface as depicted in FIG. 1, separated by purging steps using an inert gas or other method. ALD relies on the chemisorption of a gaseous precursor 109 (a tantalum halide in this case) to form a "saturated layer" of the precursor on a substrate surface 101. As depicted in FIG. 1, a partially formed saturated layer 111 is forming. This saturated layer is sometimes called a "monolayer" since it is nominally one precursor molecule in thickness. However, only a certain set of temperature and pressure conditions for a given set of reactants can support a steady state of a true monolayer of adsorbed precursor. So the saturated layer merely represents a thermodynamically distinct state of adsorbed precursor on a surface, regardless of whether the precursor forms a monolayer, a fraction of a monolayer, or some multiple of monolayers.

After temperature and pressure conditions are maintained for sufficient time to establish a fully saturated layer 103 on the substrate surface 101 (as depicted in the second frame of FIG. 1), a second gaseous reactant 105 is introduced to the substrate surface to react with the saturated layer 103 of reactant precursor (as depicted in third frame of FIG. 1). Typically, the reaction chamber and substrate environment are purged with an inert gas between reactant exposures. The reaction byproducts 113 (hydrogen and a volatile halide in this example) are then purged with another pulse of inert gas or other method, leaving a very thin film 107 (about 3 angstroms) of the desired material (e.g., tantalum or tantalum silicide or tantalum boride) on the substrate surface 101. This entire process cycle can be repeated, adding subsequent layers of the desired material, until a very conformal and uniform layer of an accurately defined desired thickness is achieved.

There are significant advantages of using ALD methods as opposed to traditional CVD or physical vapor deposition (PVD) methods when it comes to fabricating state-of-the-art microelectronics. Films can be grown at relatively low temperatures using PVD techniques, but the conformality of the deposited film is poor. This can be an unacceptable limitation, especially for the ever-shrinking smaller device feature sizes. Films with better conformality can be achieved using various CVD techniques, but they usually require deposition temperatures that are too high for process compatibility with small line width copper applications.

Unlike thermal CVD processes, ALD can be preformed at relatively low temperatures and pressures. This is because of the self-limiting nature of the formation of the saturated layer of reactant precursor. Deposition temperature and reactant flow rate are selected only such that a saturated layer of precursor is adsorbed on the substrate surface and does not depend on the amount of flux of precursor molecules impinging on the surface of the substrate or on the strict homogeneity of the precursor gas, and therefore the relatively higher temperatures that CVD demands.

ALD relies on the fact that the energy of condensation on a homogenous surface is generally lower than the energy of chemisorption between two heterogeneous surfaces. For example, consider a substrate surface (e.g., a semiconductor wafer with a barrier layer) at a low temperature, which is covered with several layers of absorbed molecules. If one raises the temperature, at a certain point, the upper layers of the molecules will begin to desorb from the substrate. This is illustrated in a generic temperature desorption plot 201 of FIG. 2, where the large, low temperature peak 203, represents the upper layers of the volatile material (or bulk) desorbing from the substrate. Next, typically, there is a temperature range where no desorption occurs. See region 205. This is because the upper layers with the lower, energy of condensation have been desorbed, but the temperature is not sufficiently high to desorb the last layer, which is chemisorbed to the substrate and is thermodynamically distinct from the bulk. Desorption of the saturated layer is represented by the smaller, higher temperature peak, 207.

Figure 2:
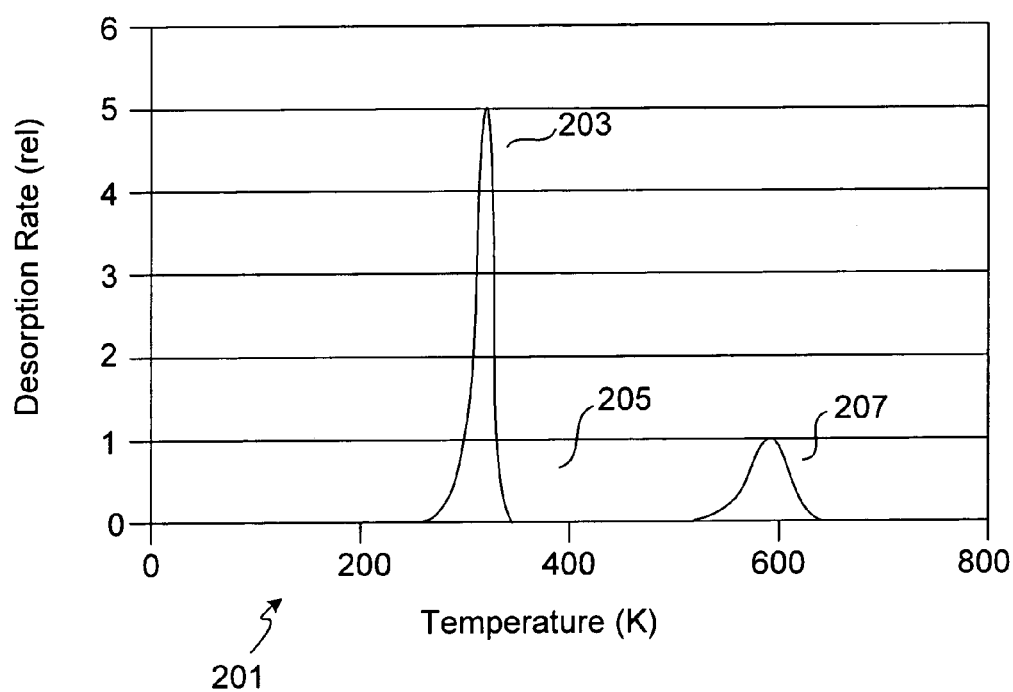
FIG. 2 is a generic temperature desorption spectroscopy graph illustrating the different temperatures for energy of chemisorption and energy of condensation

If a deposition is carried out in this temperature range, represented in the generic plot as occurring between peak 203 and peak 207, then a single saturated layer, and only a single layer, will deposit on the substrate. This temperature will vary based on the nature of the substrate and depositing molecule. Those of skill in the art will understand how to determine the temperature for saturated layer adsorption of a given substrate and precursor. In one example, one generates a plot as depicted in FIG. 2.

ALD of metals, in particular, is a chemically challenging task that requires careful selection of metal precursor and reducing agents. The metal precursor has to be stable against decomposition, adsorb and chemisorb evenly on the substrate surface, and also be easily reduced.

ALD of Tantalum

As stated above, the present invention provides methods for forming thin conformal layers of tantalum or tantalum-containing material onto a substrate. The thin layers are derived from precursor molecules conformally deposited on the substrate surface to a thickness of a monolayer or more, on up to many molecular layers. The final thickness of the tantalum layer depends on the thickness of the precursor layer as well as the number of precursor deposition/reduction cycles.

As described earlier, the present invention employs the ALD process to deposit the tantalum-containing material onto a substrate. In general, the tantalum precursor in this invention is any tantalum-containing species that can be provided in gaseous phase, can form a saturated layer on the substrate of interest and can be reduced to form tantalum metal on the surface of a substrate under available ALD process conditions. The species may be a gas at room temperature or may be a liquid or solid heated to a temperature high enough to provide sufficient vapor pressure for delivery to the substrate with an inert carrier gas. Preferably, a tantalum halide such as $TaF_5$, $TaCl_5$, $TaBr_5$ or $TaI_5$ is used for this purpose since the halides are found to have the aforementioned properties. $TaF_5$, in particular, is preferred because it has higher vapor pressure than $TaCl_5$, $TaBr_5$ and $TaI_5$.

In this invention, the subsequently added reducing agent is a hydride such as $SiH_4$, $Si_2H_6$, $B_2H_6$ or other boron hydrides. The resultant thin layer contains elemental tantalum or a mixture or tantalum with $TaSi_x$ or with $TaB_x$, depending on the reducing agent employed.

As mentioned previously, one commercially important application of the present invention is to use a layer of deposited tantalum as an effective adhesion material for copper in damascene processes in the fabrication of semiconductor wafers. The tantalum layer is deposited on top of the copper diffusion barrier and underneath an overlying copper seed layer.

The tantalum deposition processes of this invention can be used to deposit tantalum layers of controlled thickness on many different types of substrate. A primary application is for depositing a thin tantalum layer on a semiconductor wafer. A "semiconductor wafer" as discussed in this document is a semiconductor substrate at any of the various states of manufacture/fabrication in the production of integrated circuits. One standard semiconductor wafer described in this invention is a silicon wafer 200 mm in diameter, 0.75 mm thick (see SEMI Specification M1-0298). Of course, semiconductor wafers of other dimensions, such as standard 300 mm diameter silicon wafers, can also be processed in accordance with this invention. Note that standard specifications for a 300 mm diameter wafer may be found in SEMI Specification M1.15-0997.

A "substrate" is any solid on top of which a tantalum layer is to be formed in accordance with this invention. The substrate may be homogeneous or heterogeneous chemically or structurally over a scale of nanometers to micrometers. The invention is particularly valuable when the substrate has various gaps or recesses on its surface. Small gaps on the order of a micron or hundred nanometers are particularly difficult to conformally cover by conventional deposition techniques. The present invention is particularly good at conformal deposition of tantalum or tantalum-containing material within such features. It even works with high aspect ratio features having aspect ratios of 9:1 or greater.

Figure 3:
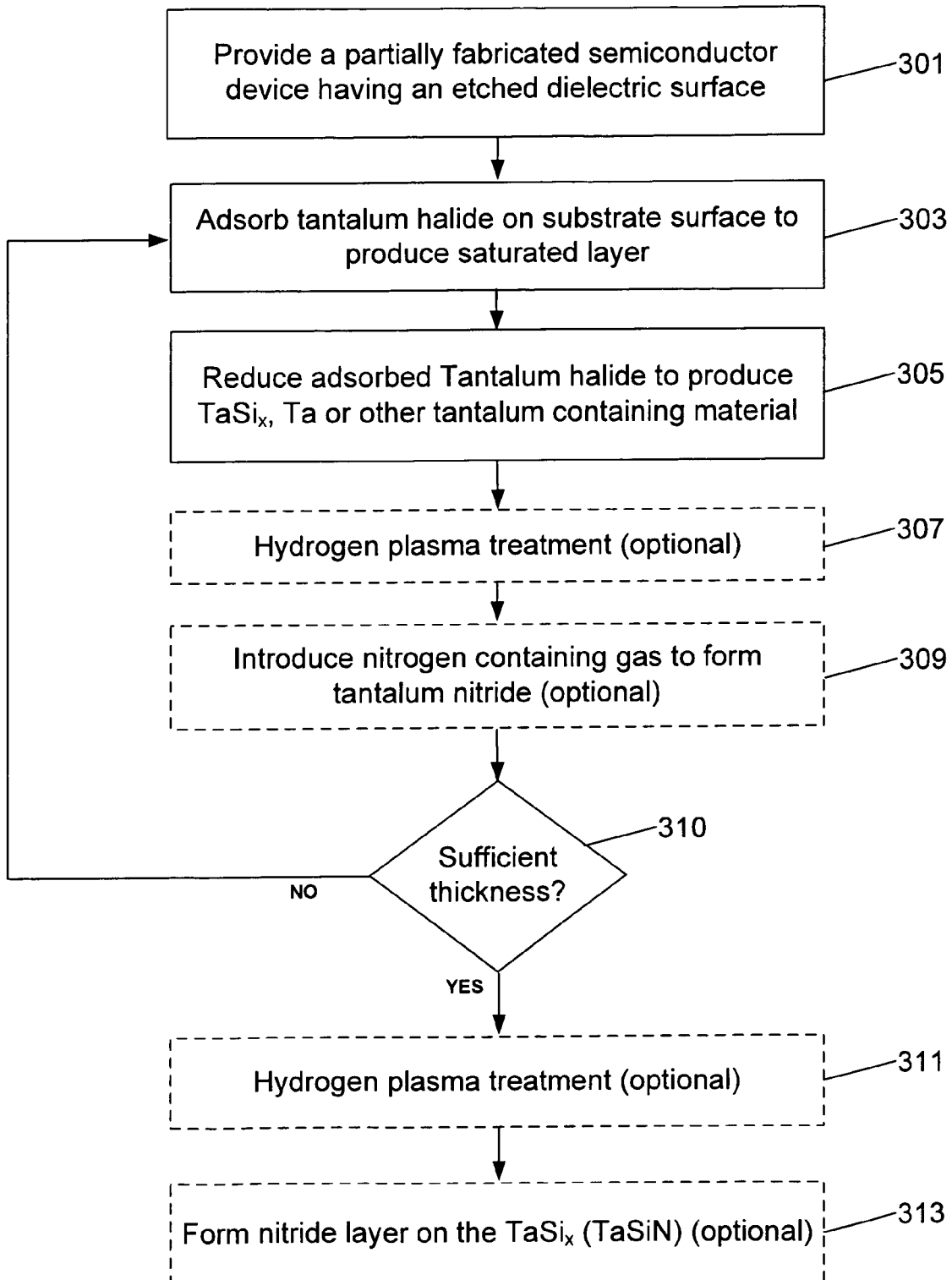
FIG. 3 is a process flow diagram illustrating relevant operations employed to perform atomic layer deposition of tantalum-containing material on a semiconductor substrate.
Figure 4A:
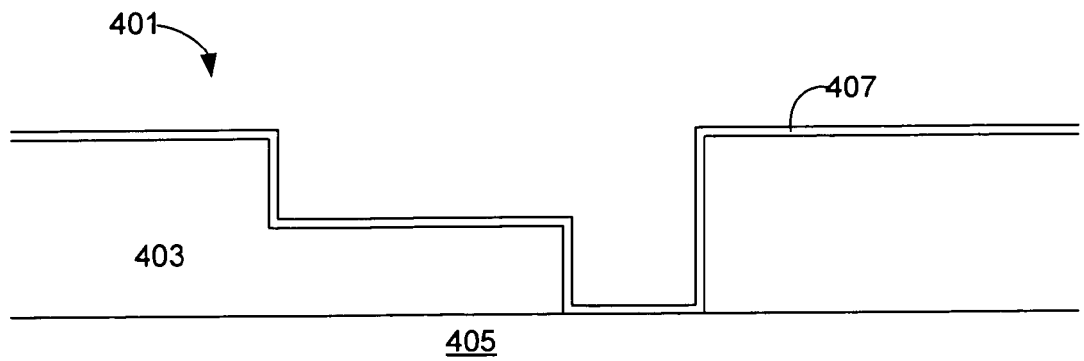
FIG. 4A is a schematic illustration of a semiconductor substrate, showing the underlying layer, dielectric substrate, diffusion barrier layer, and surface features.

A typical process flow for the tantalum ALD technique employed in accordance with this invention is illustrated in the flowchart of FIG. 3. FIGS. 4A through 4D pictorially illustrate the steps of a typical tantalum ALD process with cross sections of a portion of a semiconductor device. First a starting substrate material, typically a partially fabricated semiconductor device having an etched dielectric surface, is provided 301. FIG. 4A shows a portion of a typical partially fabricated semiconductor wafer as a starting substrate 401. An underlying support substrate 405, which may be a previously fabricated semiconductor device level, a lower metallization layer, etc., is covered by a dielectric material 403 having various etched features. A conformal diffusion barrier layer 407 covers the entire exposed surface of the wafer, including the underlying layer 405 and the dielectric layer 403. Depending on the application, dielectric layer 403 may comprise a conventional silicon oxide or doped silicon oxide material. More exotic "low-k" materials including polymers and porous materials may also be employed.

Note that typical diffusion barriers used for copper lines include titanium nitride (TiN), tantalum nitride (TaN), and a tantalum and tantalum nitride (Ta/TaN) bi-layer. Other diffusion barriers used include titanium (Ti), tantalum (Ta), tantalum nitride silicon (TaNSi), tungsten (W), titanium tungsten (TiW), titanium nitride silicon (TiNSi), tungsten nitride (WN), and ruthenium oxide ($RuO_x$). These layers are sometimes doped with silicon, carbon, boron, and/or oxygen to increase their diffusion barrier properties. This invention can be usefully applied to these compounds, but it is not limited to them. Essentially, any compound of interest that is an effective barrier against Cu diffusing through it at all post-copper deposition temperatures will work with the invention.

As stated, dielectric layer 403 has various features etched therein. In a Damascene process, these features comprise vias for connecting vertically separated layers and trenches for defining line paths in a given metallization layer. The line and via widths change with technology node. A 0.13 micron (130 nanometer) technology node includes line widths that are nominally 0.13 micron wide. At these line widths and aspect ratios of 5:1 or greater, the deposition process must be highly conformal and tightly controlled.

Returning to the discussion of FIG. 3, the semiconductor device is next exposed to a tantalum halide precursor to form a saturated layer as indicated at block 303. Again note that the invention is not limited to deposition of a single monolayer in each precursor deposition cycle. Essentially any thickness of precursor molecule may be employed: fractional layers, monolayers, bilayers, trilayers, etc. In many cases, the amount of precursor deposited is simply the amount that adsorbs on the substrate surface under a particular set of conditions. As explained previously, certain temperatures and pressures support only a monolayer of adsorbed precursor. More frequently, the saturated layer contains slightly less or somewhat more than a monolayer.

Figure 4B:
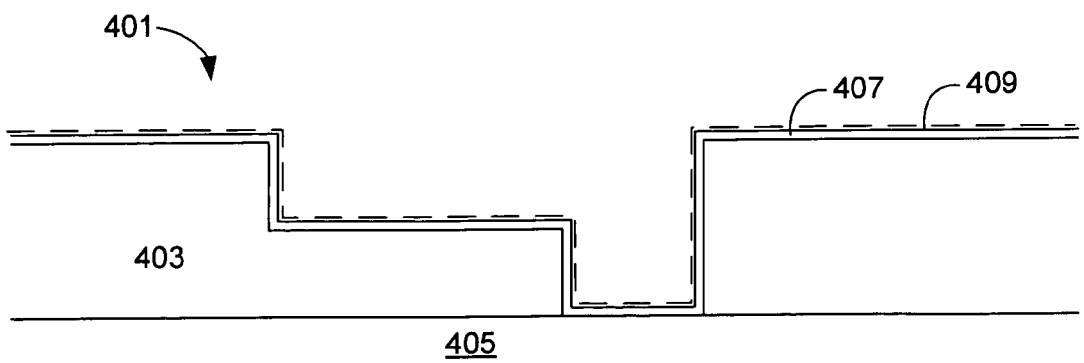
FIG. 4B shows the same semiconductor substrate as FIG. 4A with the diffusion barrier layer covered by the saturated layer of tantalum-containing material deposited by ALD.

When proper process conditions, i.e. temperature and pressure, are obtained so that a saturated layer of tantalum halide precursor is adsorbed, a hydride reducing agent is then introduced to the substrate surface leaving a thin layer (e.g., a monolayer) of tantalum or tantalum silicide ($TaSi_x$) or tantalum boride ($TaB_x$), depending on the type of hydride used. See block 305 in the flow chart. Typically, the chamber is then purged with an inert gas such as argon, although this is not required. FIG. 4B depicts the single layer of ALD-deposited conformal tantalum or tantalum silicide 409 on diffusion barrier 407. Layer 409 comprises the amount of tantalum deposited in a single ALD cycle. Layer 409 is nominally a monolayer of tantalum or tantalum silicide.

After the thin layer of tantalum-containing material 409 is formed, an optional hydrogen plasma treatment procedure is used to remove the excess halogen byproducts and unreacted halogen reactants. This hydrogen plasma treatment is recommended to more effectively chemically remove byproducts that are still adsorbed to the surfaces of the substrate and/or reactor walls, however, it is not a necessary procedure. An inert gas such as argon can be used to dilute the byproducts and remove species that are already in mobile gas phase in the reactor. See block 307 of FIG. 3. The length of time for exposure to hydrogen plasma is sufficient to remove enough halogen byproduct and unreacted reactants that they will not react or interfere with the reactants introduced in the next deposition cycle. Under typical conditions, the preferable exposure times for the hydrogen plasma pulses are between about 0.1 and 30 seconds.

Optionally, the tantalum-containing layer 409 may be exposed to nitrogen as indicated in block 309 of the FIG. 3 process flow. This operation introduces nitrogen into layer 409 in order to form a nitrogen-doped layer or a tantalum nitride. Depending on the proportion of nitrogen present, this material may maintain some of tantalum's adhesiveness, improving on tantalum's copper barrier characteristics. The nitrogen containing gas used for this step is any gas that can create the TaN under the process conditions in place. Examples of such gases are $N_2$ or $NH_3$. The exposure time to the nitridation gas varies depending on the desired level of nitridation.

Figure 4C:
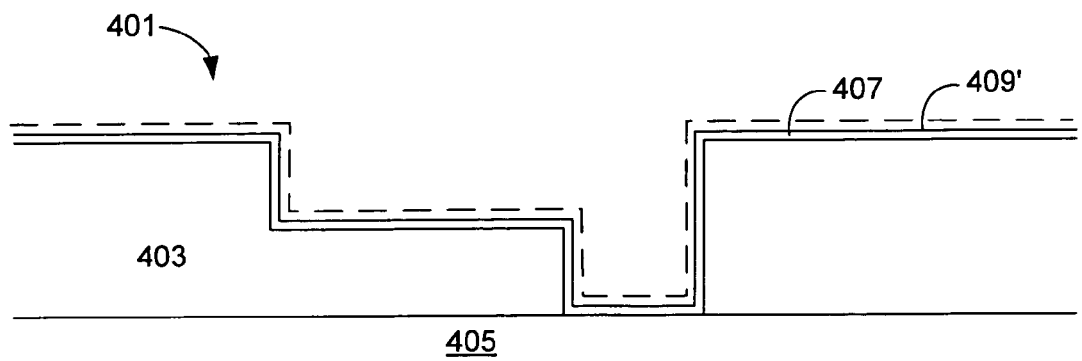
FIG. 4C shows the same semiconductor substrate as FIG. 4B with the thicker layer of tantalum containing material after several cycles of the ALD process.

If the layer of tantalum-containing material is not yet of desired thickness, subsequent cycles of the ALD technique can be implemented until a desired thickness is achieved. See decision 310 in the process flow of FIG. 3. FIG. 4C illustrates the result of a second (or subsequent) ALD cycle. A thicker tantalum containing layer 409' forms. The total thickness of this layer (and hence the total number of ALD cycles) depends on the application (diffusion barrier versus adhesion layer for example) and the technology node. For many applications, the total thickness ranges between about 5 and 50 angstroms.

Experimental results from a material analyses of a tantalum containing layer processed using $TF_5$ precursor and $SiH_4$ reducing agent under typical experimental conditions showed the tantalum containing layer to have a resistivity of between about 200 and 300 µ/cm and a density of about 12 to 13 $g/cm^3$. AES (Auger Electron Spectroscopy) analyses showed that the amount of tantalum in the layer ranged from between about 5% to 50% and amount of silicon (from silicide) ranged from between about 15% to 40%, depending on the sputter sampling depth. In general, the silicon concentration was found to be highest near the surface of the layer. Note that these results are presented only as one example and does not limit the invention to exclude the range of possible material qualities that may result from variations of experimental setup and conditions. The invention is not limited to the ranges observed in this experiment.

Figure 4D:
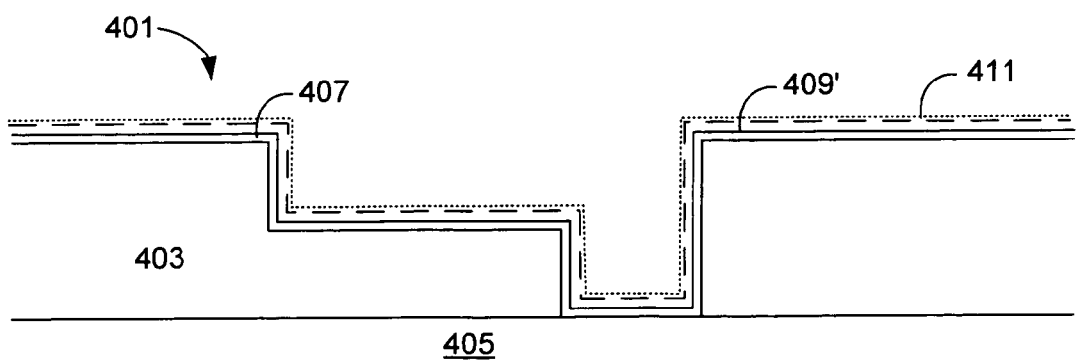
FIG. 4D shows the same semiconductor substrate as FIG. 4C with the layer of tantalum-containing material covered by a nitride layer.

After the desired tantalum layer thickness is achieved, another optional hydrogen plasma treatment (post-cycling), as described previously, can be implemented to remove excess halogen byproducts and unreacted gases 311. At this point, another optional nitridation step can be performed 313, depending on whether the desired characteristic of the top layer of the tantalum is for copper barrier or copper adhesive qualities. FIG. 4D depicts the semiconductor wafer with a thin upper nitrided layer 411 on a tantalum-containing layer 409'.

After the tantalum-containing layer is completely formed and processed as appropriate, conventional integrated circuit fabrication can continue. This includes deposition of a copper seed layer by PVD, ALD, CVD, or electroless plating for example. Alternatively, if the tantalum-containing layer is sufficiently conductive, then direct electroplating of copper onto the substrate may be appropriate. Any or all of the metallization layers may include a tantalum-containing layer deposited as described.

As mentioned previously, copper's material properties may dictate processing at temperatures below about 450° C. Therefore, the tantalum deposition processes described in this invention are preferably conducted at temperatures no greater than about 450° C. More preferably, the deposition reaction takes place at temperatures between about 100° C. and 350° C. To maintain low deposition temperatures, preferred combinations of tantalum precursor and reducing agent provide a thermodynamically favored reduction reaction. Therefore, in preferred embodiments, the reactant combinations react with a negative Gibbs free energy (ΔG).

Examples of preferred reactant combinations include tantalum halides in combination with silicon hydrides and/or boron hydrides.

Suitable pressures range from about 0.1 to 10 Torr, more preferably between about 0.5 and 1 Torr. This applies regardless of whether the process is tantalum precursor deposition or reduction of the tantalum precursor.

Generally, the deposition conditions depend upon the nature of the precursors/reactants, the length of exposure to the precursor/reactants and the desired thickness of the deposition film. The length of tantalum halide precursor exposure should be suitable to form a saturated layer under the various reaction conditions in place. Under typical conditions, the more preferable exposure times are between about 1 and 30 seconds. Likewise, the length of hydride reducing agent exposure should be such to react sufficiently with the saturated layer of tantalum precursor to leave tantalum metal on the substrate surface. Under typical conditions, the more preferable exposure times for the hydride reducing agent are between about 1 and 30 seconds.

Figure 5:
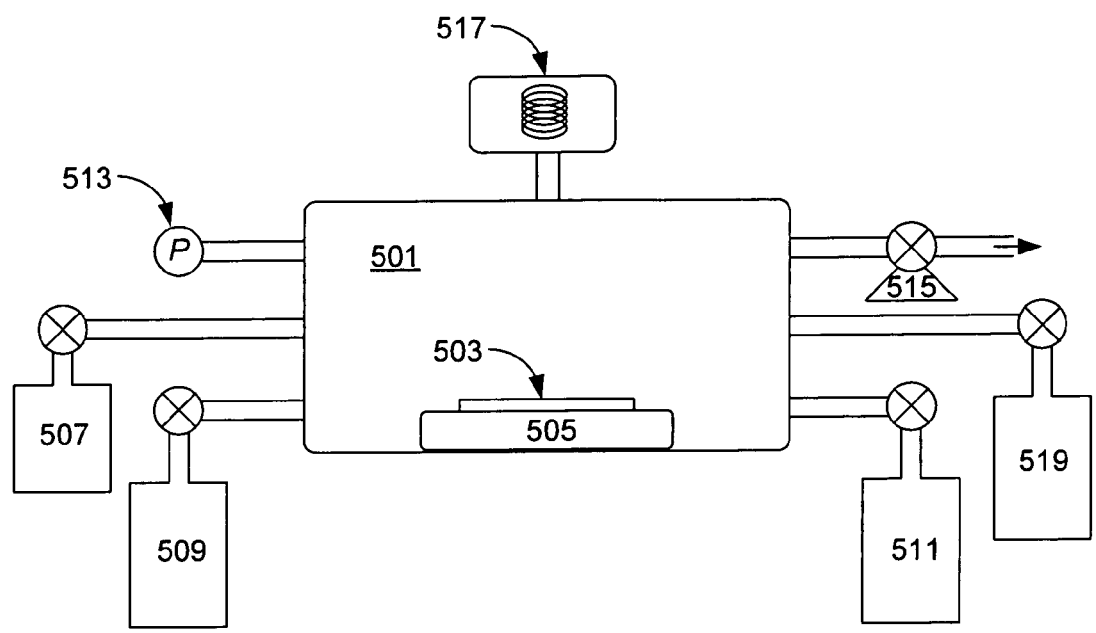
FIG. 5 is a schematic diagram showing the basic features of an ALD apparatus suitable for practicing the current invention.

FIG. 5 is a schematic of the apparatus in which the ALD reaction takes place. The semiconductor wafer 503 is placed on top of a supporting pedestal 505 in a reaction chamber 501. The supporting pedestal 505 has a thermocouple or other temperature sensing device attached to monitor the temperature of the wafer. The temperature of the wafer can be heated by any number commonly known methods, such as a wire coil. A pressure gauge 513 monitors the pressure inside the chamber during operation. The tantalum halide 507 and reducing agent hydride 509 are introduced in a controlled manner using valves. An inert gas source 511, such as argon gas, allows for more chamber pressure and reactant concentration control. A plasma generator source 517 allows for the introduction of hydrogen plasma for removing halogens after reaction described previously. Nitrogen-containing gas 519, such as $NH_3$, can be introduced for an optional nitridation step described previously. A pump with valve 515 is used to evacuate the chamber of reactant byproducts and unused reactants between cycles of sample exposure to reactant gases.

Although various details of the apparatus have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of forming a layer of tantalum-containing material on a substrate, the method comprising:
   (a) depositing from gas phase a tantalum-containing precursor onto the substrate to form an adsorbed saturated layer of the tantalum-containing precursor on the substrate, wherein the tantalum-containing precursor is deposited by a self-limiting reaction to form the adsorbed saturated layer;
   (b) contacting the tantalum-containing precursor of the saturated layer with a boron hydride or a silicon hydride to form a tantalum-containing adhesion layer; and
   (c) converting a portion of the tantalum-containing adhesion layer to a nitride diffusion barrier on the tantalum-containing adhesion layer to form a bilayer of a tantalum-containing adhesion layer and a nitride diffusion barrier,
   where the tantalum-containing adhesion layer comprise one or more of tantalum metal, tantalum silicide and tantalum boride and wherein (a) and (b) comprise introducing the tantalum-containing precursor and the hydride alternately over the substrate.

2. The method of claim 1, further comprising contacting the tantalum-containing material with a hydrogen plasma to remove halogen atoms.

3. The method of claim 1, wherein the silicon hydride is $SiH_4$ or $Si_2H_6$.

4. The method of claim 1, wherein both (a) and (b) are performed at temperatures not greater than about 450° C.

5. The method of claim 1, wherein the boron hydride is $B_2H_6$.

6. The method of claim 1, wherein the layer of tantalum-containing material comprises a tantalum silicide.

7. The method of claim 1, wherein the layer of tantalum-containing material comprises tantalum metal.

8. The method of claim 1, wherein the layer of tantalum-containing material is formed to a thickness of about three angstroms.

9. The method of claim 1, wherein (a) and (b) are repeated multiple times.

10. The method of claim 1, wherein the tantalum-containing adhesion layer is a tantalum silicide or a tantalum boride.

11. The method of claim 1, wherein the tantalum-containing adhesion layer comprises between about 15% and about 40% silicon.

12. The method of claim 1, further comprising repeating (a) and (b) to form an additional layer of tantalum-containing material.

13. The method of claim 1, wherein the tantalum-containing precursor is a tantalum halide.

14. The method of claim 1, wherein the substrate comprises a diffusion barrier layer on top of an oxide or a low-k dielectric in a semiconductor device.

15. The method of claim 1, further comprising contacting the layer of tantalum-containing material with a nitrogen-containing gas or nitrogen-containing plasma to form a tantalum nitride.

16. The method of claim 12, wherein the layer of tantalum-containing material is formed over multiple cycles to a total thickness of between about 5 and 50 angstroms.

17. The method of claim 13, wherein the tantalum halide is tantalum fluoride.

18. The method of claim 14, wherein the diffusion barrier layer is tantalum nitride.

19. The method of claim 14, wherein the diffusion barrier layer is titanium nitride.

20. The method of claim 15, wherein the nitrogen gas is $NH_3$.

* * * * *

UNITED STATES PATENT AND TRADEMARK OFFICE
CERTIFICATE OF CORRECTION

PATENT NO. : 7,144,806 B1  Page 1 of 1
APPLICATION NO. : 10/279147
DATED : December 5, 2006
INVENTOR(S) : Fair et al.

It is certified that error appears in the above-identified patent and that said Letters Patent is hereby corrected as shown below:

On the title page item (75),

In the "Inventors" section, change "Nerissa Taylor" to --Nerissa Draeger--.

Signed and Sealed this

Twelfth Day of June, 2007

JON W. DUDAS
*Director of the United States Patent and Trademark Office*